United States Patent
Bruggeman et al.

(10) Patent No.: US 12,399,049 B2
(45) Date of Patent: Aug. 26, 2025

(54) THERMAL-TYPE FLOW SENSOR WITH A THERMALLY CONDUCTIVE FRAME ELEMENT IN THE FORM OF A PRINTED CIRCUIT BOARD (PCB)

(71) Applicant: BERKIN B.V., Ruurlo (NL)

(72) Inventors: Coen Adrian Robert Tom Bruggeman, Ruurlo (NL); Tristan Doornebosch, Ruurlo (NL); Erik Pieter Van Gaasbeek, Ruurlo (NL); Hefney Job De Haan, Ruurlo (NL); Gert Jan Snijders, Ruurlo (NL); René Henri Wouter Van Der Wal, Ruurlo (NL)

(73) Assignee: BERKIN B.V., Ruurlo (NL)

( * ) Notice: Subject to any disclaimer, the term of this patent is extended or adjusted under 35 U.S.C. 154(b) by 117 days.

(21) Appl. No.: 18/018,624

(22) PCT Filed: Jul. 22, 2021

(86) PCT No.: PCT/NL2021/050468
§ 371 (c)(1),
(2) Date: Jan. 30, 2023

(87) PCT Pub. No.: WO2022/025762
PCT Pub. Date: Feb. 3, 2022

(65) Prior Publication Data
US 2023/0296417 A1    Sep. 21, 2023

(30) Foreign Application Priority Data

Jul. 30, 2020 (NL) .................................... 2026167

(51) Int. Cl.
*G01F 1/684* (2006.01)
*G01F 5/00* (2006.01)
(Continued)

(52) U.S. Cl.
CPC ............ *G01F 1/684* (2013.01); *G01F 1/6847* (2013.01); *G01F 5/00* (2013.01); *G01F 15/18* (2013.01);
(Continued)

(58) Field of Classification Search
CPC .......... G01F 1/684; G01F 1/6847; G01F 5/00; G01F 15/18; H05K 1/0278; H05K 1/05; H05K 2201/09063
See application file for complete search history.

(56) References Cited

U.S. PATENT DOCUMENTS

| 4,686,856 A | 8/1987 | Vavra et al. |
| 5,279,154 A * | 1/1994 | Vavra .................. G01F 5/00 73/202.5 |

(Continued)

FOREIGN PATENT DOCUMENTS

| WO | 9220006 A2 | 11/1992 |
| WO | 2015081958 A1 | 6/2015 |
| WO | 2015093941 A1 | 6/2015 |

*Primary Examiner* — Ryan D Walsh
(74) *Attorney, Agent, or Firm* — Tyler J. Sisk; Casimir Jones SC (57) ABSTRACT

The invention relates to a thermal-type flow sensor (1) for a flow meter, comprising a main channel part (3b) with a main channel (3) for a medium whose flow is to be determined, a sensor tube (4), having a first tube portion (5), a second, opposite tube portion (8), a sensing portion (11) connecting the first and second tube portions, at least two sensing or heating elements (12) for measuring a temperature differential or a power differential in the sensor tube, a thermally conductive frame element (13) in contact with at least the first tube portion, the second tube portion as well as the main channel part, configured to equalize temperature gradients, wherein thermally conductive frame element (13) is a printed circuit board (PCB) (14).

14 Claims, 5 Drawing Sheets

(51) Int. Cl.
*G01F 15/18* (2006.01)
*H05K 1/02* (2006.01)
*H05K 1/05* (2006.01)

(52) U.S. Cl.
CPC ............. *H05K 1/0278* (2013.01); *H05K 1/05* (2013.01); *H05K 2201/09063* (2013.01)

(56) References Cited

U.S. PATENT DOCUMENTS

| | | | |
|---|---|---|---|
| 5,309,762 A * | 5/1994 | Satoh | G01F 5/00 |
| | | | 73/204.22 |
| 5,335,553 A | 8/1994 | Ueki et al. | |
| 5,792,952 A * | 8/1998 | Ritchart | G01F 1/692 |
| | | | 73/204.27 |
| 5,803,507 A | 9/1998 | Vu | |
| 2016/0258801 A1* | 9/2016 | Hartman | G01F 15/14 |
| 2020/0370939 A1* | 11/2020 | Doerr | G01F 1/8413 |
| 2021/0255013 A1* | 8/2021 | Wu | G01F 1/8436 |
| 2022/0074775 A1* | 3/2022 | Wu | G01F 1/696 |

\* cited by examiner

THERMAL-TYPE FLOW SENSOR WITH A THERMALLY CONDUCTIVE FRAME ELEMENT IN THE FORM OF A PRINTED CIRCUIT BOARD (PCB)

CROSS REFERENCE TO RELATED APPLICATIONS

This application is a national stage application of PCT/NL2021/050468 filed Jul. 22, 2021, which claims priority to NL Application No. 2026167 filed Jul. 30, 2020, each of which are hereby incorporated by reference in their entirety.

FIELD OF THE INVENTION

The present invention generally relates to a thermal-type flow sensor for a flow meter with a thermally conductive frame element. More in particular, the invention relates to a thermal-type flow meter, comprising: a main channel part for a medium whose flow is to be determined, a sensor tube, having: a first tube portion with an inlet for being fluidly connected to the main channel part, a second, opposite tube portion with an outlet for being fluidly connected to the main channel part at another downstream position, a sensing portion connecting the first and second tube portions to allow a fluid flow though the sensor tube from the inlet to the outlet, sensing or heating elements for measuring a differential in the sensor tube in order to determine the flow and a thermally conductive frame element in contact with, at least, the first tube portion, the second tube portion and the main channel part, configured to equalize temperature gradients across the thermal-type flow sensor.

Background of the Invention

Such thermal-type flow sensors for flow meters are generally known from the prior art.

U.S. Pat. No. 4,815,280 A discloses a sensor case housing a pair of sensor coils wound around a peripheral surface of a conduit, through which a fluid flows. Two block members are provided made of materials superior in heat conductivity. At least one of said block members is provided with a pair of support projections formed integrally with said block member adjacent to both ends of said sensor coils on an inner surface thereof, wherein said conduit is held by means of said support projections.

WO 2015/093941 A1 discloses a thermal type flow meter. The flow meter comprises a base part with at least two through bores extending substantially parallel to each other. A main channel for the medium whose flow is to be determined is provided through the through bores. A part of the main channel spaced from the base part comprises a measuring tube part where the flow of the medium can be measured. The flow measuring tube comprises an insulating housing connected to the base part, which surrounds at least the measuring tube part of the main channel. The insulating housing comprises an inner housing surface, which faces the measuring tube part, as well as an outer housing surface, which faces away from the measuring tube part. A cover element connected to the base part is provided, which cover element at least substantially surrounds the insulating housing.

EP 1.867.962 A1 discloses a flow sensor of the thermal type having a U-shaped sensor tube with two essentially straight tube portions or legs and a connecting limb with two adjoining electrical resistance elements, and with a housing, which sensor tube has an inlet side where flow enters and an outlet side where flow exits, wherein the housing comprises a first and a second housing part of a thermally well-conducting material, each with an inner surface provided with cavities and with an outer surface, which housing parts are placed with their inner surfaces against each other, while the U-shaped sensor tube has a main surface that extends parallel to the inner surfaces and the housing parts surround the connecting limb and the legs of the U-shaped sensor tube such that said sensor tube is thermally clamped in between the housing parts in two locations: in a first location situated between its inlet side and the upstream resistance element and in a second location situated between its outlet side and the downstream resistance element.

US 2010/0005876 A1 discloses a thermal mass flow controller or mass flow meter having a sensor housing that reduces heat conduction from the housing mounting plate or base to the sensor itself. The housing also minimizes the thermal gradient that can result from the uneven application of heat to the housing base. This reduction is accomplished in part by the use of one or more thermal isolation slots to isolate the upper portion of the housing from the lower portion of the housing. Heat transfer to the sensor housing is also minimized by raising the middle portion of the bottom of the housing so that thermal contact is made between the base and the housing only at the two ends of the housing.

WO 92/20006 A2 discloses an apparatus for sensing a mass flow rate of a fluid in a thermal mass flow meter comprising a sensor tube. The sensor tube has a tube for carrying the fluid flow at the flow rate to be sensed. A temperature-responsive member is disposed in good heat transfer relation with the tube. The temperature-responsive member, when energized, produces, at a sensor signal node, a sensor signal responsive to the rate of mass flow of the fluid through the tube. The sensor signal is offset from a null signal condition by an unsymmetrical temperature distribution along the sensor tube when the mass flow rate of the fluid is zero. A means for modifying the temperature distribution along the sensor tube alters the unsymmetrical temperature distribution and causes the sensor signal node to produce a substantially null signal condition when the mass flow rate of the fluid through the tube is zero. The means for modifying the temperature distribution requires multiple components to achieve the desired temperature distribution.

U.S. Pat. No. 5,335,553 A discloses a fluidic gas meter including a flow path structure provided with a fluidic element, a cut-off valve, a pressure switch, a flow sensor, a piezoelectric film sensor, an electronic circuit unit, and a wiring board serving as a motherboard.

U.S. Pat. No. 4,686,856 A discloses a fluid mass flow meter that responds rapidly to changes in the rate of flow of a fluid and that is insensitive to variations in ambient temperature. The flow meter has a thermal clamp that clamps the sensor tube adjacent the extremities of a sensor disposed along the tube; a frequency compensating amplifier that, in cooperation with the thermal clamp, increases the frequency response of the meter; and an offset null bias circuit that, in combination with a bridge balancing potentiometer, corrects for the effects of variations in ambient temperature.

However, predictable thermal behaviour is very important with the abovementioned thermal-type flow sensors. The abovementioned thermal-type flow sensors, require further improvement for high-performance applications. As flows become very low, signal reproducibility often leaves a lot to be desired and the so-called "lagging effect" (i.e. the time it takes until the sensor tube, and the main channel part obtain the same temperature) is often quite noticeable and certain applications require faster temperature stabilization and higher accuracy.

Furthermore, assembling such thermal-type flow sensors is very labour-intensive. E.g. attaching the required electronics to the thermally conductive frame element, arranging the thermally conductive frame element in the housing and/or arranging and fitting the thermally conductive frame element with the electronics in the housing requires a lot of time and effort. Moreover, there is an increased chance of (human) assembly errors being made due to the relatively large number of steps involved. Last, but not least, the enclosure or housing offers relatively limited space to house the thermally conductive frame element with the electronics.

OBJECT OF THE INVENTION

It is therefore an object of the invention to provide a thermal-type sensor for a flow meter with improved predictability of thermal behaviour.

It is a further object of the invention to provide a thermal-type flow sensor, wherein the "lagging effect" is minimized.

It is yet a further object of the invention to provide a thermal-type flow sensor, wherein the thermally conductive frame element and the electronics attached thereto require less space.

It is an even further object of the invention to provide a thermal-type flow sensor, wherein a relatively lower number of steps is required to assemble the thermal-type flow sensor.

SUMMARY OF THE INVENTION

According to the invention, the thermal-type flow sensor is characterized in that the thermally conductive frame element is a printed circuit board (PCB).

The above thermal-type flow sensor provides for an improved "thermal short circuit", i.e. improved thermal conductivity, or reduced thermal resistance, between the sensor tube and the main channel part, due to the PCB balancing out, i.e. minimizing, temperature differences.

Furthermore, improved thermal stability is achieved with the above thermally conductive frame element.

In addition, the first tube portion and the second tube portion experience the same temperature of the medium. This can be very important in practice, e.g. due to a tube portion being near a hot object, such as a heating spool, negatively influencing the temperature measurements.

Moreover, due to the thermally conductive frame element acting as a printed circuit board (PCB), the required electronics can be directly attached to the frame element, saving production time and reducing the number of steps required to assemble the thermal-type flow sensor. Basically, due to the thermally conductive frame element acting as a PCB, an integrated flow meter part is created (i.e. integrated with respect to electronic, mechanical and thermal requirements), saving space in the housing. Obviously, this also reduces the possibility of assembly errors and reduces assembly time. Obviously, the thermally conductive frame element provides mechanical support.

Essentially, the thermally conductive frame element in the form of a PCB acts as a "transport means" to "balance" heat, i.e. to both supply, as well as dissipate heat. This is important, because the thermal-type flow sensor may have to deal with relatively hot fluids, relatively cold fluids, and quick transitions.

Advantageously, the thermal-type flow sensor according to the invention also solves the problem of electronics, such as chips, producing heat, which often interferes with temperature measurements, because the heat will be quickly balanced with the thermal-type flow sensor according to the invention, whereas in the prior art the heat produced by chip parts and other electronics is not dissipated, and often adversely affects sensor readout.

In this regard, it is noted that e.g. US 2009/008670 A1, in the field of LED lighting, discloses the use of an aluminium PCB as a heatsink. However, as mentioned before, the design according to US 2009/008670 A1 merely serves to dissipate heat, not to "balance" heat.

The same holds for U.S. Pat. No. 5,198,693 A, which discloses a device with apertures in the dielectric layers of an aluminium circuit to allow electrical connection to the aluminium core and enhance the thermal efficiency of integrated circuit devices attached thereto. The system disclosed in U.S. Pat. No. 5,198,693 A also serves to dissipate heat, not to balance heat.

Moreover, it should be noted that many other LED lighting designs use an aluminium PCB to dissipate heat. However, again such designs serve to dissipate heat as quickly as possible—not to thermally balance multiple points, such as 2-3 points, on the PCB. Additionally, there are far larger temperature differences in a LED device than in a flow meter; LED's may heat up to 80° C. or more in a room temperature environment. The applicant has found that such a PCB frame, despite its non-conductive layers separating the conductive tracks, can balance heat when temperature differences are small, and equalize temperature quickly. Furthermore, the electrical connections employed by common LED lighting designs do not need to have a precisely defined resistance compared to the electrical connections of the thermal-type flow sensor according to the invention.

An embodiment relates to an aforementioned thermal-type flow sensor, wherein the PCB is made of metal, preferably aluminium or copper, because of the good thermal conductivity of said metals.

An embodiment relates to an aforementioned thermal-type flow sensor, wherein the PCB comprises flow sensor electronics, which electronics may include interfaces, such as analogue or digital interfaces, sensor drive electronics and read-out electronics, or a combination thereof. Due to the flow meter electronics being comprised by or attached to the PCB, thermal management is further optimized.

An embodiment relates to an aforementioned thermal-type flow sensor, wherein the thermally conductive frame element comprising the PCB forms a flow meter enclosure, wherein the flow sensor electronics, preferably all flow sensor electronics, are enclosed by the flow meter enclosure. Thus, the thermally conductive frame element advantageously performs the double function of forming the attachment for the flow sensor electronics as well as forming an enclosure to protect the flow sensor electronics.

Another embodiment relates to said thermally conductive frame element being made out of one piece of sheet material, for example by cutting, die-cutting or lasering. In yet a further embodiment, the thermally conductive frame element comprises two parts at the front and back of the flow meter. The thermally conductive frame element can also comprise three, four, five or more parts.

An embodiment relates to an aforementioned thermal-type flow sensor, wherein the PCB is a single-layer PCB, a dual-layer PCB, or a multi-layer PCB. A single-layer PCB generally provides for a PCB of high quality, and is relatively easy to produce. The printed side can face the sensor tube or face the housing. A dual-layer PCB allows for (electrical) connections on both sides.

An embodiment relates to an aforementioned thermal-type flow sensor, wherein the PCB comprises a temperature sensor, for measuring the temperature of the thermal-type flow sensor. By arranging the temperature sensor, such as a PTC, NTC or a digital thermometer, on the PCB it is possible to accurately determine the "balance temperature" of the thermal-type flow sensor. An accurately measured temperature can be used to optimize the flow calculation. In an embodiment, it is conceivable that the aforementioned balance temperature is set or configured.

An embodiment relates to an aforementioned thermal-type flow sensor, wherein the PCB comprises at least one additional sensor chosen from the group of temperature sensors, humidity sensors, conductivity and/or pressure sensors. Adding a temperature sensor is preferred, because the entire PCB frame is temperature-balanced. Thus the skilled person has flexibility in the placement of the temperature sensor on the frame. Of course, combinations of several sensors from said group are also possible, including adding all four types of sensors.

An embodiment relates to an aforementioned thermal-type flow sensor, wherein the PCB comprises one or more folding lines, wherein the PCB has been fold-formed or form-folded or folded into an operational use shape by folding a sheet of material, in particular a sheet of metal, such as aluminium or copper, along the one or more folding lines. By folding the PCB, three-dimensional configurations are conceivable, not possible with two-dimensional PCB's.

An embodiment relates to an aforementioned thermal-type flow sensor, comprising a base part connected to the main channel part by connection means, wherein the thermally conductive frame element comprises an elastically and/or plastically deformable deformation portion with a contact surface for contacting the main channel part containing the main channel, the thermal-type flow sensor having attachment means for attaching the thermally conductive frame element to the base part, wherein the thermally conductive frame element is preferably under pretension to press the contact surface of the deformation portion against said main channel part. This achieves direct thermal contact between the thermally conductive frame element and the main channel part. The above thermal-type flow sensor provides for an improved "thermal short circuit", i.e. improved thermal conductivity, or reduced thermal resistance, between the sensor tube and the main channel part, due to the surface of the deformation portion being pressed against the main channel part. It will be clear to the skilled person that all embodiments related to the plastically deformable deformation portion can also be implemented using a frame material from the prior art, instead of a PCB frame, such as an aluminium or copper frame, to which a print plate is attached by any means. In the embodiments relating to the deformation portion, "frame element" can mean both a PCB frame and a frame made out of traditional materials, as known from the prior art.

An embodiment relates to an aforementioned thermal-type flow sensor, wherein the contact surface of the frame element is at least partly rounded, having a convex shape, such as a sinusoidal shape, to provide optimal thermal contact.

An embodiment relates to an aforementioned thermal-type flow sensor, wherein the deformation portion of the frame element comprises a central opening close to or near the contact surface. The central opening facilitates the compression by allowing the deformation portion to be pushed inwards and decreasing the size of the central opening. The deformation is preferably reversible. Thus, the deformation portion can provide constant and stable contact between the contact surface, for example by compressing a part of the frame element near the contact surface.

An embodiment relates to an aforementioned thermal-type flow sensor, wherein the total size of the central opening can be increased or decreased to alter the deformability of the deformation portion.

An embodiment relates to an aforementioned thermal-type flow sensor, having attachment means for attaching the deformation portion to the base part, preferably by riveting the parts together using additional openings in the frame element. The base part comprises openings for the first tube portion and the second tube portion. The base part preferably comprises metal.

An embodiment relates to an aforementioned thermal-type flow sensor, wherein the first tube portion, the second tube portion and the sensing portion are configured to give the sensor tube a U-shape. In this configuration, the first and second tube portion can be the legs of the U-shape. In a preferred embodiment, the first and second tube portion of the U-shape are essentially straight. Additionally, the sensing portion may be essentially straight as well, with angles of approximately 90° between the legs and the sensing portion. The corners may be rounded. However, the first and second tube portion and the sensing portion can also other shapes, such as semi-circular. The sensing portion contains the sensing/heating elements, wherein said sensing/heating elements are preferably winding coils. Platinum, copper or gold are particularly suitable materials for the winding coils. At least two sensing/heating elements are required, though three elements may be preferred in some embodiments. Embodiments comprising four five, or more sensing/heating elements are also conceivable.

An embodiment relates to a flow sensor, wherein the frame element has an I-shape, a T-shape or another elongated shape, wherein one free end of the frame element comprises the deformation portion, and another part of the frame element is in contact with the first tube portion and the second tube portion. Preferably, there are at least two sensor tube support parts in contact with the tube portions. The aforementioned shapes are all relatively easy to produce.

An embodiment relates to an aforementioned thermal-type flow sensor, comprising a base part connected to the main channel part by connection means and a preferably folded flow sensor enclosure formed by the frame element enclosing the sensor tube and optionally the base part.

An embodiment relates to an aforementioned thermal-type flow sensor, wherein a flow meter housing houses the flow meter enclosure, to provide for a further layer of insulation and protection of the flow meter enclosure and the flow sensor electronics.

An embodiment relates to an aforementioned thermal-type flow sensor, wherein the PCB is made of aluminium or copper.

An embodiment relates to an aforementioned thermal-type flow sensor, wherein the thermally conductive frame element is an integrated flow meter part.

An embodiment relates to an aforementioned thermal-type flow sensor, wherein the thermally conductive frame element provides support, in particular sideways support, to the sensor tube on opposite sides of the sensor tube. Thus, mechanical loads on the sensor tube are decreased and the sensor tube does not have to fully support its own weight.

An embodiment relates to an aforementioned thermal-type flow sensor, wherein the thermally conductive frame element comprises support parts for supporting the sensor tube.

An embodiment relates to an aforementioned thermal-type flow sensor, wherein the thermally conductive frame element is in direct physical and/or thermal contact with the main channel part.

Another aspect of the invention concerns a thermally conductive frame element, for use in an aforementioned thermal-type flow sensor, in the form of a printed circuit board (PCB), configured to be in contact with the first tube portion, the second tube portion and the main channel part of the thermal-type flow sensor, for equalizing temperature gradients across the first tube portion, the second tube portion and the main channel part.

A further embodiment relates to a bidirectional thermal-type flow sensor where a fluid is allowed to flow though the sensor tube from the inlet to the outlet and from outlet to inlet.

Another aspect of the invention relates to a method of producing an aforementioned thermally conductive frame element, for use in an aforementioned thermal-type flow sensor, comprising:
  producing a thermally conductive frame element in the form of a printed circuit board (PCB), wherein the thermally conductive frame element is configured to be in contact with the first tube portion, the second tube portion and the main channel part of the thermal-type flow sensor, for equalizing temperature gradients across the first tube portion, the second tube portion and the main channel part.

An embodiment relates to an aforementioned method, wherein the PCB comprises one or more folding lines, further comprising:
  folding the PCB into an operational use shape by folding a sheet of material, in particular a sheet of metal, such as aluminium or copper, along the one or more folding lines.

An embodiment relates to an aforementioned method, further comprising:
  shaping the PCB to comprise an elastically and/or plastically deformable deformation portion with a contact surface for contacting the main channel part, having attachment means for attaching the deformation portion to a base part connected to the main channel part by connection means, wherein the thermally conductive frame element is configured for being under pretension to press the contact surface of the deformation portion against the main channel part. Aluminium PCB's are particularly suited to the creation of a deformation portion, though a deformable portion can also be created in a frame element of the prior art.

Another aspect of the invention concerns a method of producing an aforementioned thermal-type flow sensor, comprising:
  providing a main channel part with a main channel for a medium whose flow is to be determined,
  providing a sensor tube, having:
    a first tube portion with an inlet for being fluidly connected to the main channel part,
    a second, opposite tube portion with an outlet for being fluidly connected to the main channel part at another downstream position,
    a sensing portion connecting the first and second tube portion to allow a fluid flow though the sensor tube from the inlet to the outlet,
    at least two sensing or heating elements for measuring a temperature differential in the sensor tube in order to determine the flow,
  providing a thermally conductive frame element in contact with, at least, the first tube portion, the second tube portion and the main channel part, configured to balance temperature gradients across the first tube portion, the second tube portion and the main channel part, wherein the thermally conductive frame element is a printed circuit board (PCB).

To determine the flow, e.g. a constant power method, measuring temperature or a constant temperature method, measuring power may be employed, as well as combinations of these methods. Calorimetric methods are also possible.

An embodiment relates to an aforementioned method of producing an aforementioned thermal-type flow sensor, wherein the thermally conductive frame element in the form of a printed circuit board (PCB) is produced using an aforementioned method of producing a thermally conductive frame element.

BRIEF DESCRIPTION OF THE DRAWINGS

The invention will be explained by means of the exemplary embodiments depicted in the accompanying drawings and the detailed description of the Figures below.

DETAILED DESCRIPTION

Figure 1:
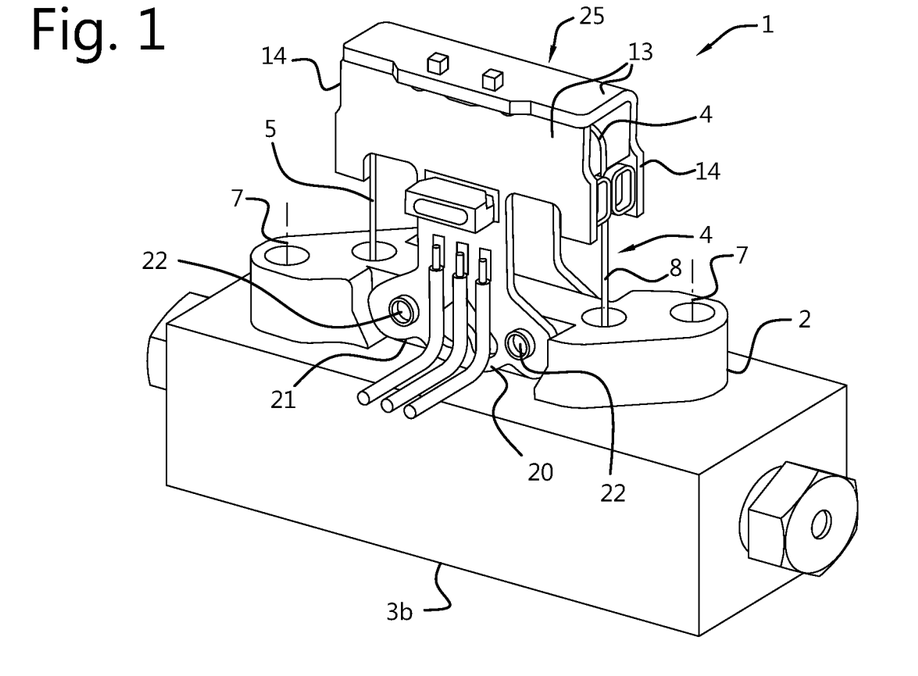
FIG. 1 shows a thermal-type flow sensor, wherein the thermally conductive frame element has two parts and the PCB is a single-layer PCB facing outwards or a dual-layer PCB.
Figure 2:
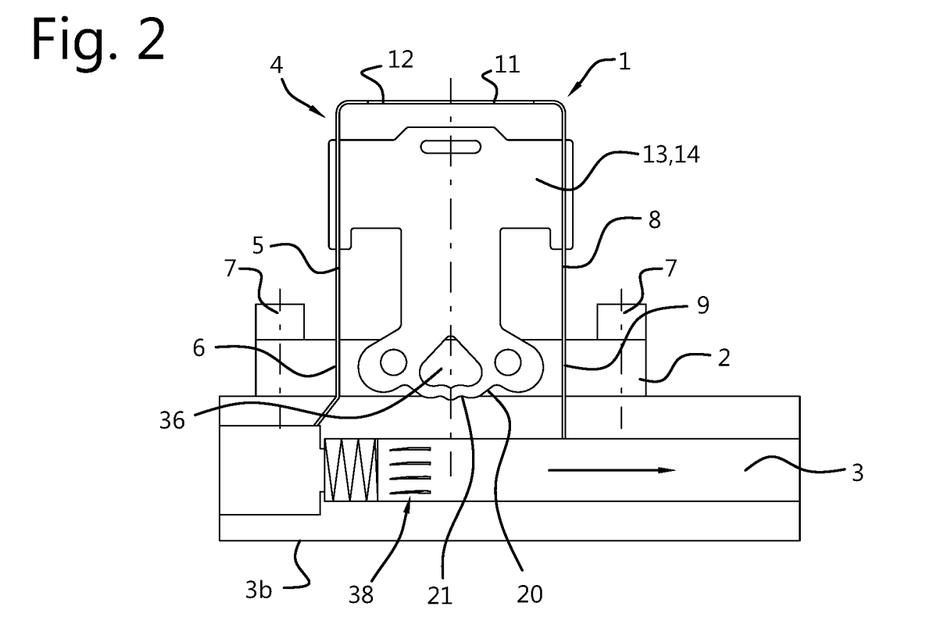
FIG. 2 schematically shows an example of a thermal-type flow sensor connected to a main channel part for performing flow measurements.

As will be shown with respect to FIGS. 1-10 (which will be discussed in conjunction), and as discussed in the foregoing, the Applicant has come up with an advantageous thermal-type flow sensor for a flow meter 1 comprising a main channel part 3b for a medium, such as a fluid, whose flow is to be determined (please see FIG. 2 in particular). The base part 2 may be connected to the main channel part 3b by appropriate connection means 7, such as bolts, rivets, screws, soldering, gluing, mechanical clamping, attachment with conductive epoxy such as silver epoxy, or the like. The connection means 7 may be provided on opposite sides (i.e. transversal to the longitudinal direction as indicated by the vertical dashed line in FIG. 2) of the thermally conductive frame element 13. Furthermore, the connection means 7 may be asymmetrically arranged with respect to a first symmetry plane aligned with the longitudinal direction of the thermal-type flow sensor 1 and being perpendicular to the longitudinal direction of the main channel part 3b and/or a second symmetry plane aligned with the longitudinal direction of the thermal-type flow sensor 1 and being parallel to the longitudinal direction of the main channel part 3b.

Figure 3:
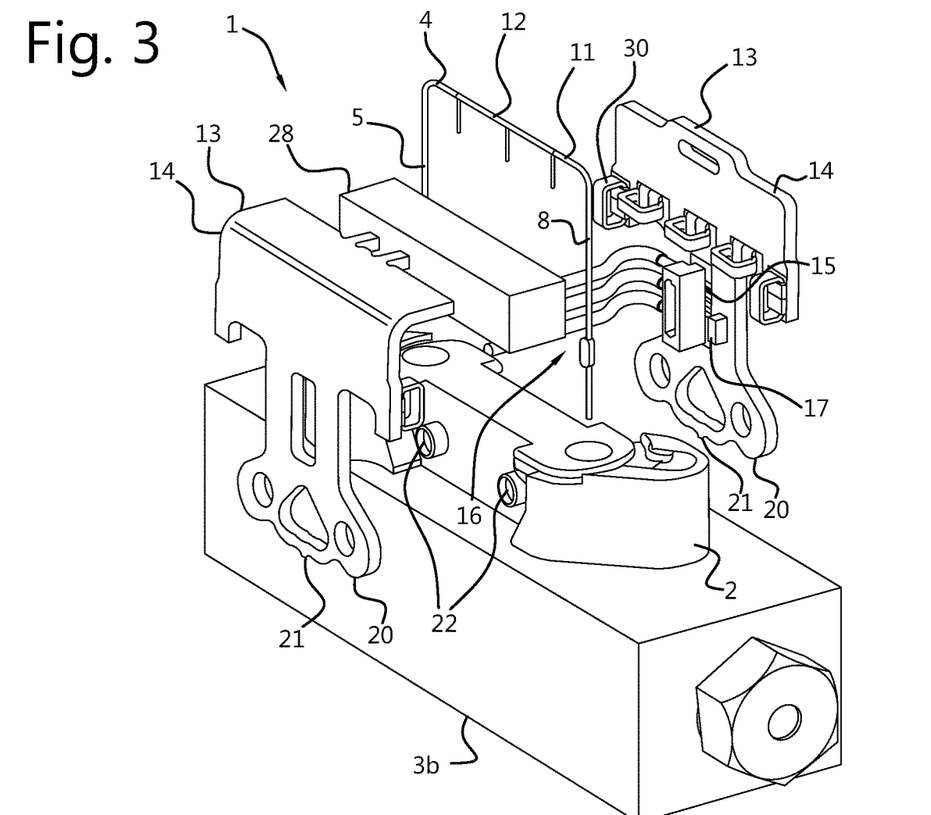
FIG. 3 shows an exploded view of a thermal-type flow sensor, wherein the thermally conductive frame element has two parts and the PCB is a single-layer PCB facing towards the sensor tube or a dual-layer PCB.

A sensor tube 4 is provided, having a first tube portion 5 with an inlet 6 for being fluidly connected to the main channel 3, as well as second, opposite tube portion 8 with an outlet 9 for being fluidly connected to the main channel 3 at another downstream position. A sensing portion 11 connects the first tube portion 5 and second tube portion 8 to allow a fluid flow though the sensor tube 4 from the inlet 6 to the outlet 9. The sensor tube 4 has a U-shape, which is shown inverted in FIG. 2. The base part 2 furthermore comprises two through-holes aligned with the longitudinal direction of the thermally conductive flow element 3 for respectively allowing the first tube portion 5 and the second tube portion 8 to connect to the main channel 3. Sensing or heating elements 12 are provided for measuring a temperature differential or a power differential in the sensor tube 4 in order to determine the flow. The at least two sensing/heating elements 12 preferably comprise a winding coil each, such as a platinum winding coil, for generating the required temperature/power differential (as known from the prior art). As shown in FIG. 3, an insulation part 28, such as a piece of foam 28, may be arranged between opposite thermally conductive frame elements 13 to provide thermal insulation and appropriate spacing.

A thermally conductive frame element 13 is in contact with at least the first tube portion 5, the second tube portion 8 as well as the main channel part 3b, configured to equalize temperature gradients across the thermal-type flow sensor 1, especially the first tube portion 5, the second tube portion 8 and the main channel part 3b, such that optimal thermal "balancing" is achieved. The first tube portion 5, the second tube portion 8 and the main channel part 3b can be thermally coupled by for instance soldering, gluing, mechanical clamping, attachment with conductive epoxy such as silver epoxy, or by means of the sensor tube supports 30, as e.g. shown in FIGS. 3 and 4. These sensor tube supports 30 then provide the thermal contact between the sensor tube 4 and the thermally conductive frame element 13. The sensor tube supports 30 may comprise a deformable material, preferably provided with a metal coating or a woven metal gauze. In a preferred embodiment, there are two symmetrically placed sensor tube supports 30, and in another preferred embodiment a third sensor tube support 30 is added to support the middle of the tube 4. More supports 30 may be needed for some tubes.

The thermally conductive frame element 13 is in the form of or comprises a printed circuit board (PCB) 14. The PCB 14 is preferably made of metal, more preferably aluminium (Al) or copper (Cu). However, other materials with suitable thermal characteristics are also conceivable. The thermally conductive frame element 13 may in general be made from a material that has suitable specific heat capacity, thermal conductivity, density and/or thermal diffusivity, such as Au, Ag, Pt, Cu, Al, W, Zi or Zamak, RVS, AlN, SiC, SiN, diamond, graphene or graphite. The thermally conductive frame element 13 can also comprise a composite or a laminate that includes the aforementioned materials, or the material can be a coating on the thermally conductive frame element 13.

The PCB 14 preferably comprises (all) flow sensor electronics 15 (please refer to FIG. 3), i.e. the flow sensor electronics 15 are (all) attached to the thermally conductive frame element 13.

As shown in FIGS. 1, 3, 9 and 10, the thermally conductive frame element 13 comprising the PCB 14 may form a flow sensor enclosure 25, wherein the flow sensor electronics 15, preferably all (temperature-sensitive) flow sensor electronics 15, are enclosed by the flow sensor enclosure 25. The PCB 14 may be a single-layer PCB, a dual-layer PCB, or a multi-layer PCB. Preferably, the PCB 14 comprises one or more additional sensors 17 chosen from the group of temperature sensors, humidity sensors, conductivity sensors and/or pressure sensors. The PCB 14 may also be provided with a connector (not shown) for providing a data connection with an external computer system (not shown).

As shown in FIGS. 1-7C, the thermal-type flow sensor 1 may comprise an elastically and/or plastically deformable deformation portion 20 with a contact surface 21 for contacting the main channel part 3b to establish optimal thermally conductive contact with the main channel part 3b (i.e. to further equalize temperatures). Preferably, the thermally conductive frame element 13 is under pretension to press the contact surface 21 of the deformation portion 20 against the main channel part 3b. The contact surface 21 preferably is at least partly rounded for providing optimal contact with the main channel part 3b, even when the longitudinal axis of the thermal-type flow sensor 1 may not be fully perpendicular to the main channel part 3b.

The deformation portion 20 may comprise a central opening 36 close to the contact surface 21 and/or two side openings 37. The two side openings 37 may be arranged for receiving attachment/connection means 22, such as rivets or bolts, for connecting the deformation portion 20 to the base part 2, such as to one side or two opposite sides of the base part 2. The deformation portion 20 is configured and/or connected in such a way to the base part 2, that, during use, the contact surface 21 is pressed against the main channel part 3b to ensure good thermal contact.

Figure 4:
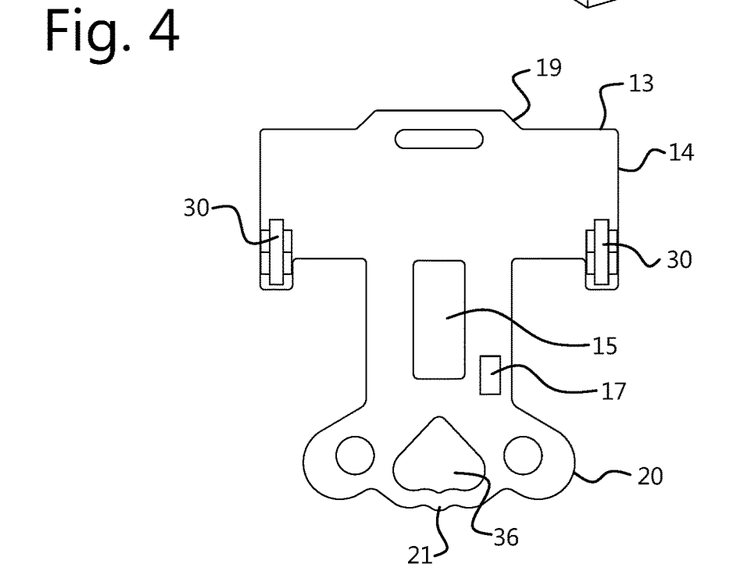
FIG. 4 shows an example of a thermally conductive frame element in the form of a PCB.

Further referring to FIG. 4, the thermally conductive frame element 13 is in contact with the sensor tube 4 to provide a thermal short-circuit through the sensor tube supports 30 (respectively, left and right in FIG. 4).

To ensure that there is good thermal contact with the main channel part 3b, the bottom of the thermally conductive frame element 13 is provided with a deformation portion 20 in the form of a "resilient" element 20, preferably made of the same material. The resilient element 20 is designed in such a way that it always exerts force on the main channel part 3b.

The resilient element 20 preferably adjusts itself: it is first pushed through the elastic deformation zone to the plastic zone of deformation. The force exerted by the resilient element 20 is well-defined within a narrow bandwidth. It is therefore a repetitive thermal contact that is sought after, to be realized with a resilient element 20.

The resiliency of the resilient element 20 provides an additional function in absorbing shocks or vibrations, although the main purpose is to guarantee thermal contact through a highly constant contact between the thermally conductive frame element 13 and the main channel part 3b, which is also (almost) the same between individual thermal-type flow sensors 1.

The resilient element 20 can be elastically deformed, plastically deformed or both.

Figure 5:
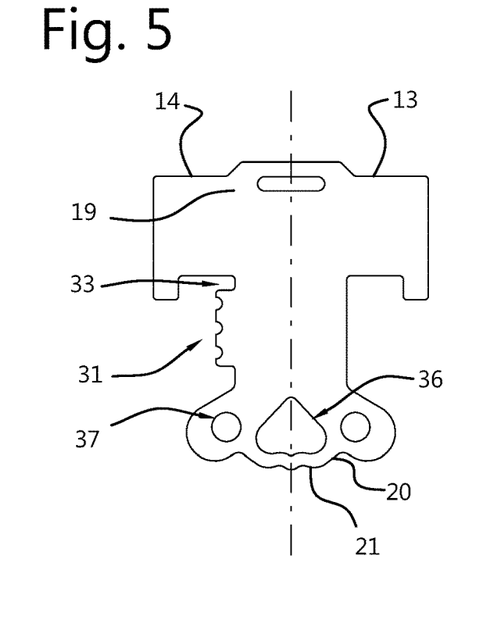
FIGS. 5 and 6 show several examples of PCB shapes in top view.
Figure 6:
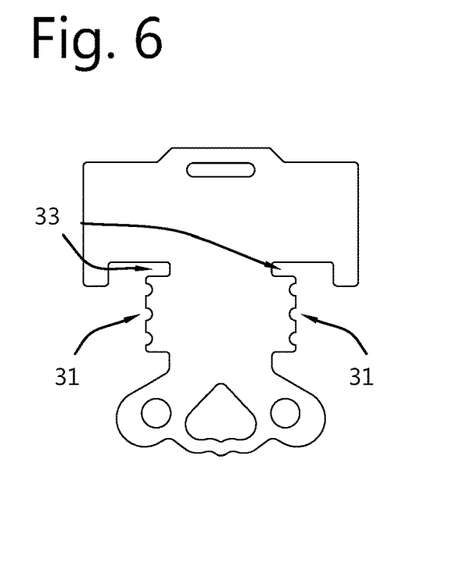
Figure 7A:
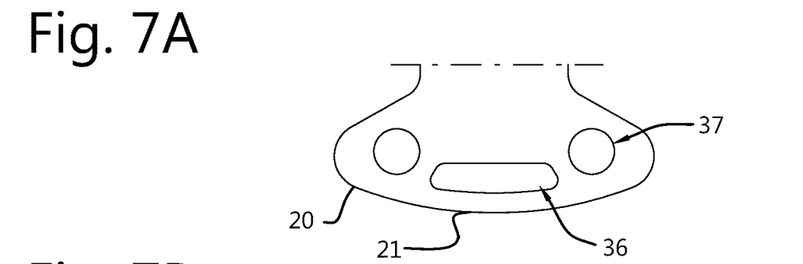
FIGS. 7A-7E show several examples of the deformation portion.
Figure 7B:
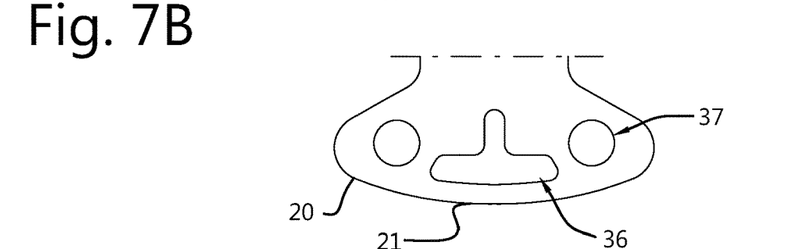
Figure 7C:
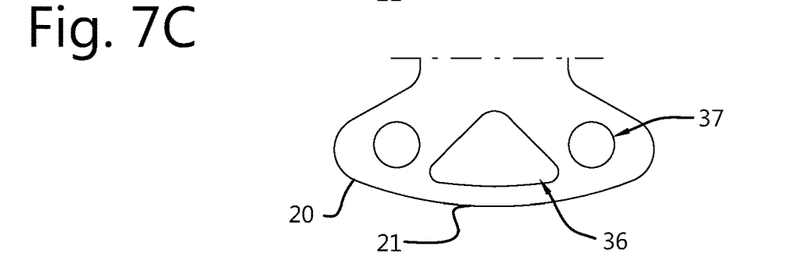
Figure 7D:
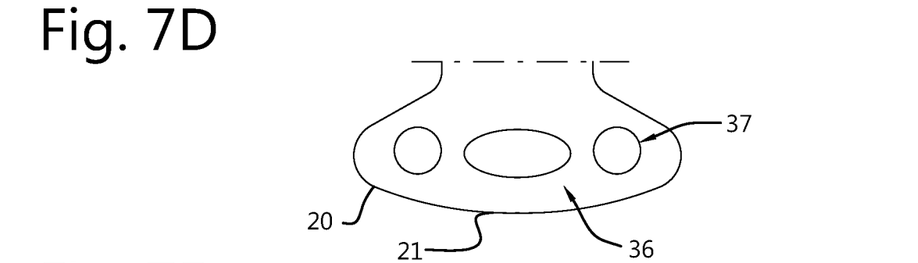
Figure 7E:
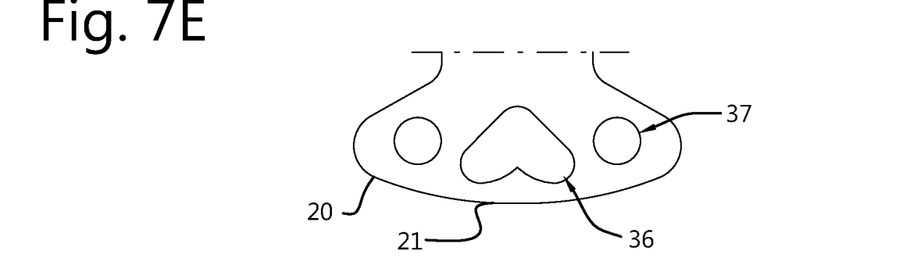

The deformation portion or resilient element 20 of the thermally conductive frame element 13 may comprise a central opening 36 for allowing resilient contact of the contacting surface 21 to the main channel part 3b, thus allowing for the deformation portion or resilient element 20 to be slightly compressed when in contact with the main channel part 3b. The central opening 36 is shaped to deform or compress predictably, ensuring a constant thermal contact, and to limit strain and fatigue. The central opening 36 may be rectangular, modified rectangular (FIG. 7A), round, half round, square, modified square or modified hourglass. The central opening 36 preferably has a triangular shape, a modified triangular shape, a rounded triangular shape (FIG. 7C), a reverse T-shape, a rounded reverse T-shape (FIG. 7B), an oval shape (FIG. 7D), a modified oval shape, a semicircular shape, a lunette shape, a heart shape (FIG. 7E), a modified heart shape, or more preferably an accolade heart shape (as shown in FIGS. 4-6).

In another related embodiment, the deformation portion or resilient element 20 comprises one or more cantilevers that can be compressed when in contact with the main channel part 3b to ensure constant thermal contact.

The embodiments comprising a central opening 36 or a cantilever can also be part of a traditional frame element.

In a preferred embodiment, the contact points with the main channel part 3b, especially the part of the main channel part 3b containing the laminar flow element (LFE) 38 are at the same temperature. To achieve this, the contact points between the frame element 13 are positioned as close to the LFE 38 as possible. The thermal input is therefore preferably placed on a symmetrical thermal point. The shape of the contact point can vary.

The thermally conductive frame element 13 may be approximately I-shaped, wherein one end (i.e. the bottom end) of the I-shaped frame comprises the deformation portion 20, and at least two sensor tube support parts 30 of the I-shaped frame are in contact with the first tube portion 5 and the second tube portion 8. Alternatively, the thermally conductive frame element 13 may be approximately T-shaped.

Figure 8:
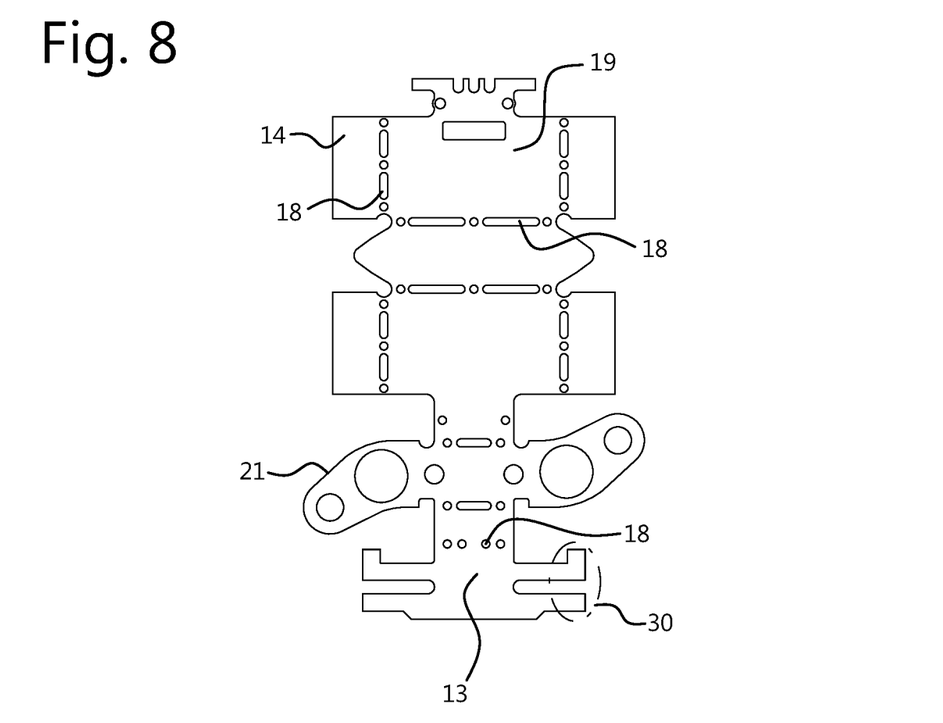
FIG. 8 shows an example of a sheet of material with folding lines to be folded into an operational shape.
Figure 9:
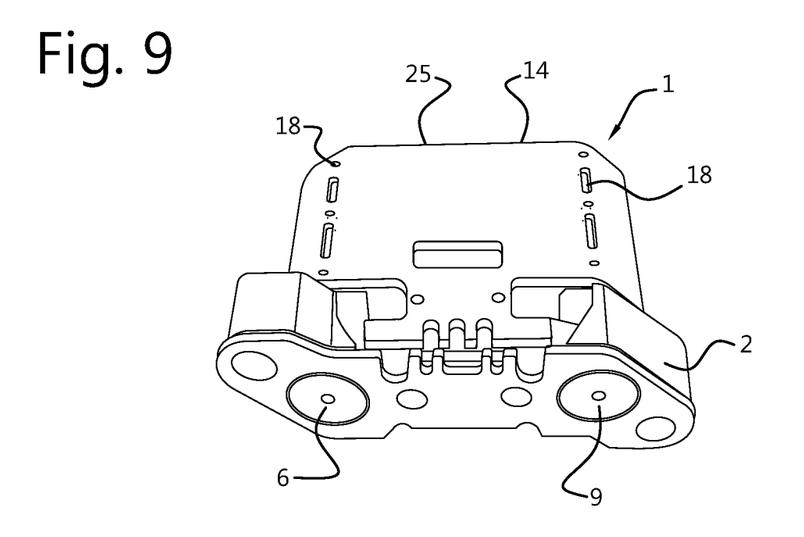
FIG. 9 shows the sheet of material of FIG. 8 folded into the operational shape, wherein the sheet of material forms a flow meter enclosure.

As shown in FIGS. 8 and 9, the PCB 14 may comprise one or more folding lines 18. The folding lines may be of any type suitable for folding or form-folding or fold-forming the chosen material. Advantageously, the PCB 14 may be folded into an operational use shape by folding a sheet of material 19, in particular a sheet of metal, such as aluminium or copper, along the one or more folding lines 18. The folding line may comprise a dashed line. Laser cutting is a preferred method for making the dashed line.

Figure 10:
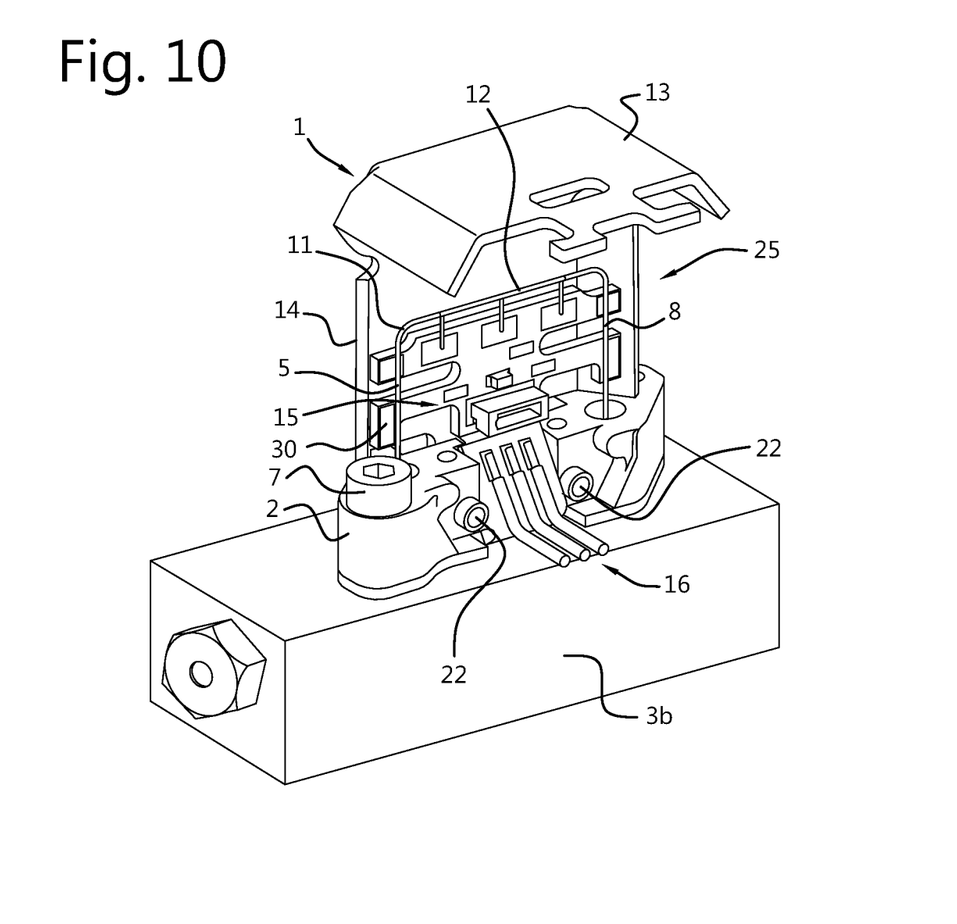
FIG. 10 shows a perspective view an example of a thermal-type flow sensor, wherein a folded sheet of material forms a flow meter enclosure.

As mentioned before, the thermally conductive frame element 13 may form a flow sensor enclosure 25 enclosing the sensor tube 4 and optionally the base part 2. The sheet of material 19 may be folded along the folding lines 18 to form such an enclosure 25. Alternatively, the sheet of material 19 may be folded along the folding lines 18 to form the flow sensor enclosure 25, as shown in FIGS. 9 and 10 to protect the flow sensor 1 internals from outside influences. A further flow sensor housing, such as a cap (not shown), may also house the flow sensor enclosure 25. Preferably, such a cap only touches the base part 2. Contact between the cap and the thermally conductive frame element 13, the sensor tube 4 and the sensing/heating elements 12 should preferably be avoided. The flow sensor enclosure 25 thus protects and supports the sensor tube 4. The flow sensor housing may provide an additional protective and insulative layer by encapsulating the flow sensor enclosure 25. The flow sensor enclosure 25 and the flow sensor housing may protect the sensor from draughts.

FIGS. 8-10 also provide another alternative for the contact surface 21 of the deformation portion 20 by enveloping the sensor tube 4 and the base part 2 in a folded sheet of material 19 which serves as a frame element 13. The folded sheet of material 19 comprises sensor tube supports 30 and a part between two fold lines which serves as a contact surface 21, with openings for the inlet 6 and the outlet 9 of the sensor tube 4. This contact surface 21 of the folded sheet of material 19 is in contact with the main channel part 3b. Here, the thermal equilibration is facilitated by the large area of contact.

As stated before, another aspect of the invention concerns a thermally conductive frame element 13, for use in an aforementioned thermal-type flow sensor 1, in the form of a printed circuit board (PCB) 14, configured to be in contact with the first tube portion 5, the second tube portion 8 and the main channel part 3b of the thermal-type flow sensor 1, for equalizing temperature gradients across the first tube portion 5, the second tube portion 8 and the main channel part 3b.

Yet another aspect of the invention concerns a method of producing an aforementioned thermally conductive frame element 13, comprising:

producing a thermally conductive frame element 13 in the form of a printed circuit board (PCB) 14, wherein the thermally conductive frame element 13 is configured to be in contact with the first tube portion 5, the second tube portion 8 and main channel part of the thermal-type flow sensor 1, for equalizing temperature gradients across the first tube portion 5, the second tube portion 8 and main channel part. As mentioned before, the PCB 14 may be folded into an operational use shape, i.e. a final shape, by folding a sheet of material 19, in particular a sheet of metal, such as aluminium or copper, along the one or more folding lines 18. Therein, the PCB 14 may be shaped to comprise an elastically and/or plastically deformable deformation portion 20 with a contact surface 21 for contacting the main channel 3, wherein the thermally conductive frame element 13 preferably is configured for being under pretension to press the contact surface 21 of the deformation portion 20 against the main channel 3.

Another aspect of the invention concerns a method of producing an aforementioned thermal-type flow sensor 1, comprising:

providing a main channel part 3b for a medium whose flow is to be determined, providing a sensor tube 4, having:

a first tube portion 5 with an inlet 6 for being fluidly connected to the main channel 3, a second, opposite tube portion 8 with an outlet 9 for being fluidly connected to the main channel, a sensing portion 11 connecting the first 5 and second tube portion 8 to allow a fluid flow though the sensor tube 4 from the inlet 6 to the outlet 9, at least two sensing or heating elements 12 for measuring a temperature differential or a power differential in the sensor tube 4 in order to determine the flow, providing a thermally conductive frame element 13 in contact with, at least, the first tube portion 5, the second tube portion 8 and main channel part 3b, configured to equalize temperature gradients across the thermal-type flow sensor 1, especially the first tube portion 5, the second tube portion 8 and main channel part 3b, wherein the thermally conductive frame element 13 is a printed circuit board (PCB) 14.

Therein, the thermally conductive frame element 13 in the form of a printed circuit board (PCB) 14 may be produced using an aforementioned method.

FIGS. 5 and 6 show several examples of PCB 14 shapes in planar view, as well as perspective view. The PCB 14 shapes may contain (transversal) recesses 33 and/or (transversal) protrusions for optimally routing the electrical wiring 16 around the PCB 14, such that tension on the electrical wiring 16 is avoided as much as possible. From practice, it appears that in particular the example of FIG. 6 with symmetric wiring support portions 31 is beneficial for reducing tension on the electrical wiring 16, while at the same time providing a thermally optimal and flexible PCB 14 design.

LIST OF REFERENCE NUMERALS

1. Thermal-type flow sensor
2. Base part
3. Main channel; 3b. Main channel part
4. Sensor tube
5. First tube portion
6. Inlet
7. Connection means
8. Second tube portion
9. Outlet
10. -
11. Sensing portion
12. Sensing/heating elements
13. Thermally conductive frame element
14. Printed Circuit Board (PCB)
15. Flow meter electronics
16. Electrical wiring
17. Additional sensor
18. Folding line
19. Sheet of material
20. Deformation portion
21. Contact surface
22. Attachment/connection means
23. -
24. -
25. Flow sensor enclosure
26. -
27. -
28. Insulation
29. -
30. Sensor tube support
31. Wring support portion
32. -
33. Transversal recess
34. -
35. -
36. Central opening
37. Side opening
38. Laminar flow element

The invention claimed is:

1. A thermal-type flow sensor for a flow meter, comprising:
   a main channel part comprising a main channel for a medium whose flow is to be determined,
   a sensor tube, having:
      a first tube portion with an inlet for being fluidly connected to the main channel,
      a second, opposite tube portion with an outlet for being fluidly connected to the main channel at another downstream position,
      a sensing portion connecting the first and second tube portions to allow a fluid flow though the sensor tube from the inlet to the outlet,
   at least two sensing or heating elements for measuring a temperature differential or a power differential in the sensor tube in order to determine the flow,
   a thermally conductive frame element in contact with at least the first tube portion, the second tube portion and the main channel part, configured to equalize temperature gradients across the thermal-type flow sensor, first tube portion, the second tube portion and main channel part, characterized in that the thermally conductive frame element is a printed circuit board (PCB) in direct physical contact with the main channel part.

2. The thermal-type flow sensor according to claim 1, wherein the PCB is made of metal.

3. The thermal-type flow sensor according to claim 1, wherein the PCB comprises flow sensor electronics.

4. The thermal-type flow sensor according to claim 1, wherein the PCB is a single-layer PCB, a dual-layer PCB, or a multi-layer PCB.

5. The thermal-type flow sensor according to claim 1, wherein the PCB comprises at least one additional sensor chosen from the group of temperature sensors, humidity sensors, conductivity sensors and pressure sensors.

6. The thermal-type flow sensor according to claim 1, wherein the PCB comprises one or more folding lines, wherein the PCB has been folded into an operational use shape by folding a sheet of metal along the one or more folding lines.

7. The thermal-type flow sensor according to claim 6, wherein the sheet of metal is an aluminum sheet or a copper sheet.

8. The thermal-type flow sensor according to claim 1, comprising a base part connected to the main channel part by connection means, wherein the thermally conductive frame element comprises at least one of an elastically and plastically deformable deformation portion with a contact surface for contacting the main channel part, having attachment means for attaching the deformation portion to the base part.

9. The thermal-type flow sensor according to claim 8, wherein the deformation portion comprises a central opening close to the contact surface, wherein the central opening is at least one of a modified triangular shape, a rounded reverse T-shape, a modified oval shape, a heart shape or an accolade heart shape.

10. The thermal-type flow sensor according to claim 1, comprising a base part connected to the main channel part by connection means and a flow sensor enclosure formed by the frame element enclosing the sensor tube.

11. The thermal-type flow sensor according to claim 1, wherein the thermally conductive frame element is a single piece of sheet material.

12. The thermal-type flow sensor according to claim 1, wherein the thermally conductive frame element comprises support parts for supporting the sensor tube and provides support to the sensor tube on opposite sides of the sensor tube.

13. A method of producing a thermal-type flow sensor according to claim 1, comprising:
   providing a main channel part comprising a main channel for a medium whose flow is to be determined,
   providing a sensor tube, having:
      a first tube portion with an inlet for being fluidly connected to the main channel,
      a second, opposite tube portion with an outlet for being fluidly connected to the main channel, a sensing portion connecting the first and second tube portion to allow a fluid flow though the sensor tube from the inlet to the outlet, at least two sensing or heating elements for measuring a temperature differential or a power differential in the sensor tube in order to determine the flow, providing a thermally conductive frame element in contact with, at least, the first tube portion, the second tube portion and the main channel part, and configuring the thermally conductive frame element to equalize temperature gradients across the first tube portion, the second tube portion and the main channel part, wherein the thermally conductive frame element is a printed circuit board (PCB).

14. A method of producing a thermally conductive frame element for use in a thermal-type flow sensor of a flow meter, the thermal-type flow sensor comprising:

a main channel part comprising a main channel for a medium whose flow is to be determined, a sensor tube, having:
 a first tube portion with an inlet for being fluidly connected to the main channel,
 a second, opposite tube portion with an outlet for being fluidly connected to the main channel at another downstream position,
 a sensing portion connecting the first and second tube portions to allow a fluid flow though the sensor tube from the inlet to the outlet,
 at least two sensing or heating elements for measuring a temperature differential or a power differential in the sensor tube in order to determine the flow, a thermally conductive frame element in contact with at least the first tube portion, the second tube portion and the main channel part, configured to equalize temperature gradients across the thermal-type flow sensor, first tube portion, the second tube portion and main channel part, characterized in that the thermally conductive frame element is a printed circuit board (PCB), the method comprising:

providing a sheet of metal comprising one or more folding lines and folding the sheet of metal along the one or more folding lines to produce a printed circuit board (PCB) and shaping the PCB to comprise at least one of an elastically deformable deformation portion or a plastically deformable deformation portion, wherein the deformation portion comprises a contact surface for contacting the main channel part, wherein the PCB functions as the thermally conductive frame element and is configured to be in contact with the first tube portion, the second tube portion and the main channel part of the thermal-type flow sensor, and wherein the PCB equalizes temperature gradients across the first tube portion, the second tube portion and the main channel part.

* * * * *